United States Patent
Bovington et al.

(10) Patent No.: US 10,141,710 B2
(45) Date of Patent: Nov. 27, 2018

(54) RING-RESONATOR-BASED LASER WITH MULTIPLE WAVELENGTHS

(71) Applicant: Oracle International Corporation, Redwood Shores, CA (US)

(72) Inventors: Jock T. Bovington, La Jolla, CA (US); Xuezhe Zheng, San Diego, CA (US)

(73) Assignee: Oracle International Corporation, Redwood Shores, CA (US)

( * ) Notice: Subject to any disclaimer, the term of this patent is extended or adjusted under 35 U.S.C. 154(b) by 363 days.

(21) Appl. No.: 15/047,090

(22) Filed: Feb. 18, 2016

(65) Prior Publication Data
US 2018/0159293 A1    Jun. 7, 2018

(51) Int. Cl.
*H01S 3/083*    (2006.01)
*H01S 3/067*    (2006.01)
(Continued)

(52) U.S. Cl.
CPC ............ *H01S 3/083* (2013.01); *G02F 1/0147* (2013.01); *G02F 1/3133* (2013.01); *H01S 3/06791* (2013.01); *H01S 3/1301* (2013.01); *H01S 5/1071* (2013.01); *H01S 5/4068* (2013.01); *H01S 5/4087* (2013.01); *H01S 5/5045* (2013.01); *H04B 10/572* (2013.01); *H04J 14/02* (2013.01); *G02F 2201/58* (2013.01);
(Continued)

(58) Field of Classification Search
CPC .... H01S 3/083; H01S 3/06791; H01S 3/1301; H01S 5/1071; H01S 5/142; H01S 5/5042; H01S 5/0612; H01S 5/0687; G02F 1/3133; H04J 14/02
See application file for complete search history.

(56) References Cited

U.S. PATENT DOCUMENTS

2012/0189025 A1*   7/2012   Zheng .................. H01S 5/1071
                                                                  372/20
2017/0324218 A1*   11/2017   Krishnamoorthy ..... H01S 5/141

OTHER PUBLICATIONS

Niemoto et al.; "Narrow spectral linewidth wavelength tunable laser with Si photonicwire waveguide ring resonators," Group IV photonics, ThD4, 126-128 (2012).
(Continued)

*Primary Examiner* — Armando Rodriguez
(74) *Attorney, Agent, or Firm* — Park, Vaughan, Fleming & Dowler LLP (57) ABSTRACT

An optical source includes semiconductor optical amplifiers, with a semiconductor other than silicon, which provide an optical gain medium. Moreover, a photonic chip in the optical source, which is optically coupled to the semiconductor optical amplifiers, includes ring resonators that selectively pass corresponding optical signals having carrier wavelengths provided by the semiconductor optical amplifiers, where a given ring resonator and a reflector on one of the semiconductor optical amplifier defines an optical cavity, and the ring resonators have different radii with associated resonance wavelengths corresponding to the carrier wavelengths. Furthermore, the photonic chip includes a shared ring resonator, optically coupled to the ring resonators, that selectively filters the optical signals, where the shared ring resonator has a different radius than the radii of the ring resonators with an associated resonance wavelength, and a free-spectral range of the shared ring resonator defines a spacing between the carrier wavelengths in the optical signal.

20 Claims, 8 Drawing Sheets

(51) Int. Cl.
  *H04J 14/02* (2006.01)
  *H01S 5/50* (2006.01)
  *H01S 3/13* (2006.01)
  *G02F 1/313* (2006.01)
  *H01S 5/10* (2006.01)
  *G02F 1/01* (2006.01)
  *H04B 10/572* (2013.01)
  *H01S 5/40* (2006.01)
  *H01S 5/14* (2006.01)
  *H01S 5/0687* (2006.01)

(52) U.S. Cl.
  CPC ........ *G02F 2203/58* (2013.01); *H01S 5/0687* (2013.01); *H01S 5/142* (2013.01)

(56) References Cited

OTHER PUBLICATIONS

Fujioka et al.; "Compact and low power consumption hybrid integrated wavelength tunable laser module using silicon waveguide resonators," J. of Lightwave Technology 28 (21), 3115-3120 (2010).

Akiyama et al.; "1-Vpp 10-Gb/s operation of slow-light silicon Mach-Zehnder modulator in wavelength range of 1 nm," Group IV photonics, WC7, 45-47 (2010).

Akiyama et al.; "Wavelength-tuning-free 10-Gb/s operation of a silicon-integrated resonantly-enhanced modulator and single-mode laser," Group IV photonics, FD3, 358-360 (2012).

Hulme et al.; "Widely tunable Vernier ring laser on hybrid silicon.," Opt. Express, vol. 21, No. 17, pp. 19718-19722, Aug. 2013.

Lee et al.; "High power and widely tunable Si hybrid external-cavity laser for power efficient Si photonics WDM links.," Opt. Express, vol. 22, No. 7, pp. 7678-7685, Apr. 2014.

Heck et al.; "Hybrid Silicon Photonic Integrated Circuit Technology," IEEE J. Sel. Top. Quantum Electron., vol. 19, No. 4, pp. 6100117-6100117, Jul. 2013.

Krishnamoorthy et al.; "Exploiting CMOS Manufacturing to Reduce Tuning Requirements for Resonant Optical Devices," IEEE Photonics J., vol. 3, No. 3, pp. 567-579, Jun. 2011.

\* cited by examiner

RING-RESONATOR-BASED LASER WITH MULTIPLE WAVELENGTHS

GOVERNMENT LICENSE RIGHTS

This invention was made with U.S. government support under Agreement No. HR0011-08-9-0001 awarded by DARPA. The U.S. government has certain rights in the invention.

BACKGROUND

Field

The present disclosure relates to the design of an optical source. More specifically, the present disclosure relates to the design of an optical source in which a free-spectral range of a shared ring resonator or a multiple of the free-spectral range defines a spacing between carrier wavelengths in an optical signal.

Related Art

In order to scale wavelength-division-multiplexing (WDM) communications, it is highly desirable to have a multiple wavelength laser that can extend the bandwidth on a single optical fiber well into the terahertz. In the telecommunications industry, this challenge is currently solved by using temperature-controlled arrays of single-wavelength lasers or highly calibrated arrays of tunable lasers, which can be used to create a WDM array by having each of the tunable lasers tuned to corresponding channels in the WDM array.

However, the separate channels in the WDM array typically need to be multiplexed, which can increase the size of a multiple-wavelength optical source and the optical loss. Moreover, fabricating a multiple-wavelength optical source to obtain equally spaced channels is also typically challenging.

Consequently, the optical source often needs to include redundancy circuits to ensure reliability. In addition, the optical source usually uses a tunable multiplexer instead of a fixed multiplexer (which maps predefined wavelengths to fixed spatial inputs and outputs). These additional features can increase the cost and the complexity of the optical source, which can be prohibitive in many applications.

Hence, what is needed is an optical source without the above-described problems.

SUMMARY

One embodiment of the present disclosure provides an optical source that includes semiconductor optical amplifiers, defined in a semiconductor other than silicon, which have first edges and second edges. These semiconductor optical amplifiers are optically coupled to a reflective element (such as a reflective coating and, more generally, a broadband reflective element) on the first edges, and each of the semiconductor optical amplifiers provides a given optical signal having a given carrier wavelength at the second edges (which may have anti-reflective coatings). Moreover, the optical source includes a photonic chip optically coupled to the semiconductor optical amplifiers. The photonic chip includes first optical waveguides, having third edges and fourth edges, that convey the optical signals, where the third edges are optically coupled to corresponding second edges of the semiconductor optical amplifiers. The photonic chip includes ring resonators, optically coupled to the first optical waveguides between the third edges and the fourth edges, that selectively pass corresponding optical signals having the carrier wavelengths, where the ring resonators and the reflective elements define optical cavities, and the ring resonators have different radii with associated resonance wavelengths corresponding to the carrier wavelengths.

Moreover, the photonic chip includes a shared optical waveguide, having a fifth edge and a sixth edge, that conveys an optical signal having the carrier wavelengths, where the shared optical waveguide is optically coupled to the ring resonators between the fifth edge and the sixth edge. Furthermore, the photonic chip includes: a second photodetector, optically coupled to the sixth edge, that monitors the carrier wavelengths in the optical signal; and a shared ring resonator, optically coupled to the shared optical waveguide, that selectively passes the optical signal, where the shared ring resonator has a different radius than the radii of the ring resonators with an associated resonance wavelength, and where one of a free-spectral range of the shared ring resonator and a multiple of the free-spectral range defines a spacing between the carrier wavelengths in the optical signal. Additionally, the photonic chip includes: a second optical waveguide having a seventh edge, optically coupled to the shared ring resonator, that conveys the optical signal; and a third photodetector, optically coupled to the seventh edge, that monitors the carrier wavelengths in the optical signal.

In some embodiments, the optical source includes first photodetectors, optically coupled to the fourth edges, that monitor the carrier wavelengths in the optical signals. Moreover, the photonic chip may include: a thermal-tuning mechanism (such as a doped semiconductor heater and/or a metal heater) thermally coupled to the ring resonators; and control logic, electrically coupled to the thermal-tuning mechanism and the first photodetectors, that tunes the resonance wavelengths of the ring resonators based on the carrier wavelengths monitored by the first photodetectors. The thermal-tuning mechanism may also be thermally coupled to the shared ring resonator, and the control logic may be electrically coupled to the second photodetector and the third photodetector. During operation, the control logic may tune the resonance wavelength of the shared ring resonator based on the carrier wavelengths monitored by at least one of the second photodetector and the third photodetector.

Furthermore, the optical source may include third optical waveguides, optically coupled to the first optical waveguides, that output the optical signals on edges of the third optical waveguides.

Additionally, the second optical waveguide may have an eighth edge optically coupled to the shared optical waveguide, and the optical signal may be output from the optical source at the fifth edge of the shared optical waveguide. Note that the optical coupling between the first optical waveguides and the ring resonators may be critically coupled, and the optical coupling between the ring resonators and the shared optical waveguide may be under coupled.

Alternatively, the second optical waveguide may have an eighth edge, the second optical waveguide may be optically coupled to the shared optical waveguide, and the optical signal may be output from the optical source at the eighth edge of the second optical waveguide. Note that the optical coupling between the first optical waveguides and the ring resonators may be near critically coupled, and the optical coupling between the ring resonators and the shared optical waveguide may be near critically coupled.

In some embodiments, the fourth edges of the first optical waveguides output the optical signals. Note that the optical coupling between the first optical waveguides and the ring resonators may be under coupled, and the optical coupling between the ring resonators and the shared optical waveguide may be critically coupled.

Moreover, the optical coupling between the shared optical waveguide and the shared ring resonator and the optical coupling between the shared ring resonator and the second optical waveguide may be symmetric.

Furthermore, a given ring resonator and the shared ring resonator may be a Vernier ring pair in which a combined free-spectral range of the optical source is a least common multiple of a free-spectral range of the given ring resonator and the free-spectral range of the shared ring resonator. Note that the combined free-spectral range of the given ring resonator and the shared ring resonator may be greater than a gain bandwidth of a given semiconductor optical amplifier that corresponds to the given ring resonator.

Additionally, the optical source may include phase tuners optically coupled to the first optical waveguides.

In some embodiments, the photonic chip includes: a substrate; a buried-oxide layer disposed on the substrate; and a semiconductor layer disposed on the buried-oxide layer, where optical components are defined in the semiconductor layer. For example, the substrate, the buried-oxide layer and the semiconductor layer may constitute a silicon-on-insulator technology.

Another embodiment provides a system that includes: a processor; a memory that stores a program module; and the optical source. During operation, the program module is executed by the processor.

Another embodiment provides a method for generating optical signals using the optical source.

This Summary is provided merely for purposes of illustrating some exemplary embodiments, so as to provide a basic understanding of some aspects of the subject matter described herein. Accordingly, it will be appreciated that the above-described features are merely examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF THE FIGURES

Note that like reference numerals refer to corresponding parts throughout the drawings. Moreover, multiple instances of the same part are designated by a common prefix separated from an instance number by a dash.

DETAILED DESCRIPTION

Embodiments of an optical source (such as a laser, which is sometimes referred to as a 'hybrid external cavity laser'), a system that includes the optical source, and a technique for generating optical signals are described. The optical source includes semiconductor optical amplifiers, with a semiconductor other than silicon, which provide an optical gain medium. Moreover, a photonic chip in the optical source, which is optically coupled to the semiconductor optical amplifiers, includes ring resonators that selectively pass corresponding optical signals having the carrier wavelengths provided by the semiconductor optical amplifiers. Note that a given ring resonator and a reflective element on one of the semiconductor optical amplifier defines an optical cavity, and the ring resonators have different radii with associated resonance wavelengths corresponding to the carrier wavelengths. Furthermore, the photonic chip includes a shared ring resonator, optically coupled to the ring resonators, that selectively filters an optical signal that includes the carrier wavelengths, where the shared ring resonator has a different radius than the radii of the ring resonators with an associated resonance wavelength, and one of a free-spectral range (FSR) of the shared ring resonator and a multiple of the FSR defines a spacing between the carrier wavelengths in the optical signal.

By using the combination of the ring resonators and the shared ring resonator, the optical source can output one or more optical signals that include the carrier wavelengths with a consistent spacing or channel spacing (such as 2 nm). Thus, the optical source may lock the channel spacing of a wavelength-division-multiplexing (WDM) laser array to a fixed spacing (thereby eliminating the usual variation of up to 5 nm from device to device that can occur in such a laser array). Moreover, each of the ring resonators provides a single, narrow bandwidth reflection spectrum that can be tuned (e.g., based on measurements at an optical monitor or through ports of the ring resonators) to align this peak with the laser optical cavity mode in a given optical cavity. In this way, the optical source may be highly integrated (and, thus, compact), high efficiency and low loss (by eliminating unnecessary components and outputs), and may offer design flexibility. Therefore, the optical source can provide a low-cost, compact, energy-efficient optical source for use in inter-chip and intra-chip connections, such as WDM silicon-photonic links. Furthermore, the optical source may help facilitate high-speed inter- and intra-chip silicon-photonic interconnects, as well as associated systems that can include this component (such as high-performance computing systems).

Figure 1:
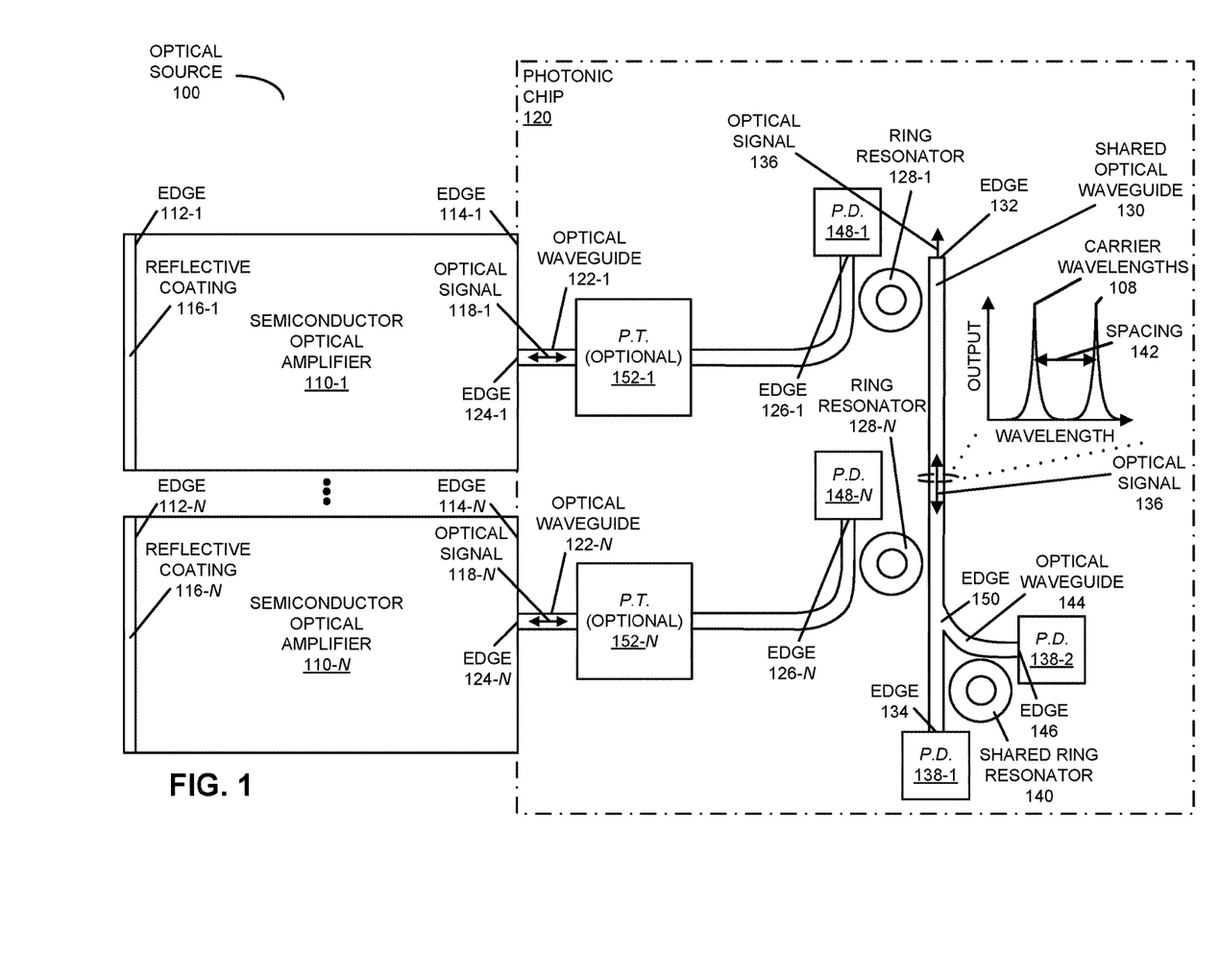
FIG. 1 is a block diagram of a top view of an optical source in accordance with an embodiment of the present disclosure.

We now describe embodiments of the optical source. FIG. 1 presents a block diagram of a top view of an optical source 100. This optical source includes semiconductor optical amplifiers 110, defined in a semiconductor other than silicon, which have edges 112 and 114. For example, semiconductor optical amplifiers 110 may be defined in a III-V semiconductor (such as gallium-arsenide or indium-phosphide), erbium or germanium, which provides an optical gain or active medium. A given semiconductor optical amplifier (such as semiconductor optical amplifier 110-1) includes a reflective element (such as a reflective coating 116-1 or, alternatively, a separate component, e.g., a broadband reflective element or a mirror) optically coupled to edge 112-1 (thus, semiconductor optical amplifier 110-1 may be a reflective semiconductor optical amplifier), and provides an optical signal 118-1 at edge 114-1 (which may include an anti-reflective coating). In particular, optical signal 118-1 may have an associated carrier or fundamental wavelength λ (such as 1.3 or 1.55 µm). (However, in some embodiments, a high reflectivity mirror is integrated into the III-V semiconductor instead of using reflective coating 116-1, such as: a strong DBR, a notched mirror, a metal layer, etc.). Thus, semiconductor optical amplifiers 110 may provide optical signals 118 having carrier wavelengths 108.

Moreover, optical source 100 includes a photonic chip 120, optically coupled to semiconductor optical amplifiers 110, which includes multiple optical paths in different optical cavities. In particular, photonic chip 120 includes optical waveguides 122, having edges 124 and 126, that convey optical signals 118, where edges 124 are optically coupled to corresponding edges 114 of semiconductor optical amplifiers 110. Photonic chip 120 also includes ring resonators 128 (which are sometimes referred to as 'channel ring resonators'), optically coupled to optical waveguides 122 between edges 124 and 126, that at least partially selectively pass corresponding optical signals 118 having carrier wavelengths 108. Note that ring resonators 128 and reflective coatings 116 define the optical cavities, and ring resonators 128 have different radii with associated resonance wavelengths corresponding to carrier wavelengths 108.

Furthermore, photonic chip 120 includes a shared optical waveguide 130, having edges 132 and 134, that conveys an optical signal 136 having carrier wavelengths 108, where shared optical waveguide 130 is optically coupled to ring resonators 128 between edges 132 and 134. Photonic chip 120 also includes: photodetector (P.D.) 138-1 (or a monitor), optically coupled to edge 134, that monitors carrier wavelengths 108 in optical signal 136 (e.g., by measuring at least a portion of optical signal 136); and a shared ring resonator 140, optically coupled to shared optical waveguide 130, that at least partially selectively passes optical signal 136 (i.e., shared ring resonator 140 may function as a shared optical cavity mirror and filter), where shared ring resonator 140 has a different radius (such as a larger radius or a smaller radius) than the radii of ring resonators 128 with an associated resonance wavelength, and where an FSR of shared ring resonator 140 or a multiple of the FSR defines a spacing (or a channel spacing) 142 between carrier wavelengths 108 in optical signal 136. (In particular, the FSR may be a multiple of spacing 142.) Additionally, photonic chip 120 includes: optical waveguide 144 having edge 146, optically coupled to shared ring resonator 140, that conveys optical signal 136; and a photodetector 138-2, optically coupled to edge 146, that monitors carrier wavelengths 108 in optical signal 136 (e.g., by measuring at least a portion of optical signal 136).

Figure 2:
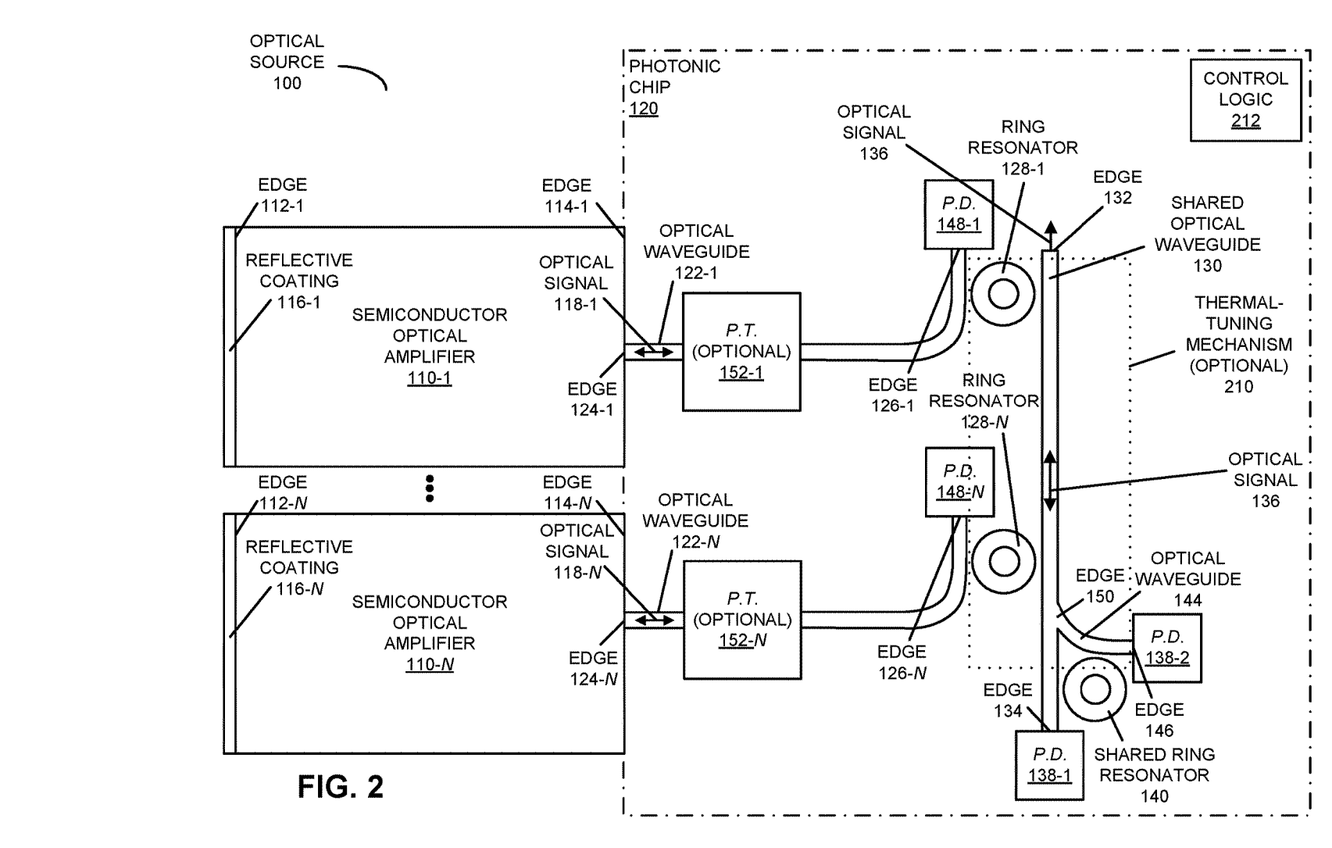
FIG. 2 is a block diagram of a top view of the optical source in FIG. 1 in accordance with an embodiment of the present disclosure.

In some embodiments, optical source 100 includes photodetectors 148 (or monitors), optically coupled to edges 126, that monitor carrier wavelengths 108 in optical signals 118 (e.g., by measuring at least a portion of optical signals 118). Moreover, as shown in FIG. 2, which presents a block diagram of a top view of optical source 100, photonic chip 120 may include: an optional thermal-tuning mechanism 210 (such as a doped semiconductor heater and/or a metal heater) thermally coupled to ring resonators 128 (e.g., optional thermal-tuning mechanism 210 may be disposed above, below or proximate to ring resonators 128); and control logic 212 (which may be a circuit implemented in silicon), electrically coupled to optional thermal-tuning mechanism 210 and photodetectors 148, that tunes the resonance wavelengths of ring resonators 128 (and, thus, the lasing wavelengths) based on carrier wavelengths 108 monitored by photodetectors 148 (e.g., based on differences between carrier wavelengths 108 and target wavelengths). Optional thermal-tuning mechanism 210 may also be thermally coupled to shared ring resonator 140, and control logic 212 may be electrically coupled to photodetectors 138-1 and 138-2. During operation, control logic 212 may tune the resonance wavelength of shared ring resonator 140 based on carrier wavelengths 108 monitored by at least one of photodetectors 138-1 and 138-2. However, more generally, control logic 212 may tune the resonance wavelengths of ring resonators 128 and/or shared ring resonator 140 based on carrier wavelengths 108 monitored by one or more of photodetectors 138-1, photodetectors 138-2 and/or photodetectors 148. Note that ring resonators 128 and/or shared ring resonator 140 may be thermally tuned individually and/or as a group (which may provide energy savings).

For example, control logic 212 may implement a wavelength-based feedback loop based on the measurements performed by photodetectors 138-1, photodetectors 138-2 and/or photodetectors 148. In particular, photodetectors 138-1, photodetectors 138-2 and/or photodetectors 148 may measure one or more tunable wavelengths (or, equivalently, carrier wavelengths) associated with photodetectors 138-1, photodetectors 138-2 and/or photodetectors 148, and control logic 212 may use this information to adjust a heater power to thermally tune one or more of ring resonators 128 and/or shared ring resonator 140. Alternatively, optical source 100 may include an interface (not shown) that receives wavelength-feedback information from an optional external wavelength sensor (not shown).

While FIG. 2 shows optional thermal-tuning mechanism 210 and control logic 212, note that the other embodiments of the optical source may include these components, too. In addition to optional thermal-tuning mechanism 210, there may also be additional thermal-tuning mechanisms (not shown) associated with each of ring resonators 128, so that ring resonators 128 can be tuned individually.

Referring back to FIG. 1, optical waveguide 144 may have an edge 150 optically coupled to shared optical waveguide 130, and optical signal 136 may be output from optical source 100 at edge 132 of shared optical waveguide 130. In FIG. 1, at edge 150, shared optical waveguide 130 may split optical signal 136 equally into optical waveguide 144 and shared optical waveguide 130 via a Y-junction structure or directional coupler (such as a 50/50 directional coupler). Moreover, shared ring resonator 140 may optically couple to components of optical signal 136 between optical waveguide 144 and shared optical waveguide 130. Note that the optical coupling between optical waveguides 122 and ring resonators 128 (as determined by a gap between optical waveguides 122 and ring resonators 128) may be critically coupled, and the optical coupling between ring resonators 128 and shared optical waveguide 130 may be under coupled (which may determine an output ratio of a given one of optical signals 118 in optical signal 136). For example, the gap between optical waveguides 122 and ring resonators 128 may be between 150-300 nm. Note that 'critical coupling' depends on the optical loss (including any other optical couplers). In particular, 'critical coupling' occurs when the amount of light coupling in or out of a ring resonator equals the optical loss during one round trip around the ring resonator.

Moreover, the optical coupling between shared optical waveguide 130 and shared ring resonator 140 and the optical coupling between shared ring resonator 140 and optical waveguide 144 may be symmetric.

In some embodiments, optical source 100 includes phase tuners (P.T.) 152 optically coupled to optical waveguides 122.

Note that a given ring resonator in ring resonators 128 and shared ring resonator 140 may be a Vernier ring pair in which a combined FSR of optical source 100 may be a least common multiple of an FSR of the given ring resonator (which corresponds to a radius of the given ring resonator) and the FSR of shared ring resonator 140 (which corresponds to a radius of the shared ring resonator). For example, if the FSR of a given ring resonator is 2 nm, and if there are 10 channels (and, thus, ten ring resonators 128), optical source 100 may have a combined FSR of 20 nm. Note that the combined FSR may be greater than a gain bandwidth of a given semiconductor optical amplifier that corresponds to the given ring resonator, which may help ensure that optical source 100 does not mode-hop to an adjacent reflection mode as the environment changes (this may allow additional filter elements to be omitted from optical source 100).

Thus, an uncertainty in spacing 142 may be reduced to the fabrication error of shared ring resonator 140, which may have an FSR tolerance of 0.1 nm or approximately 1% (which, in principle, can be reduced further). This precision thereby enables a reduced channel spacing compared to laser arrays that must have a guard band to prevent crosstalk between tightly spaced channels that each have their own fabrication error.

Consequently, optical source 100 can be designed to have a finer bandwidth filter than an array-waveguide or echelle-grating-based lasers. Given the size of ring resonators 128 and the gain elements, this bandwidth may help eliminate mode-hopping.

Note that in the event of a failure on one of the laser channels, the shared-bus architecture may allow a replacement laser to take the place of the failed one by appropriately tuning ring resonators 128. In particular, the spare may move its resonance wavelength to the target wavelength of the failed channel, and the failed channel may be parked outside of the functioning channels. Thus, optical source 100 may also provide improved reliability. While this redundancy is not possible if the failure is due to a shared element in the laser cavity, in general silicon circuits are far more reliable and have a superior yield to III-V gain elements, so such a circuit-level redundancy may still have a significant impact on the overall reliability of most implementations.

Similarly, note that channels can be added and dropped using the shared-bus architecture to create a flexible bandwidth for a link, without changing the single-channel data rate, the number of carrier wavelengths 108 (or the number of subcarriers), or the encoding.

During operation of optical source 100, semiconductor optical amplifiers 110 may be turned on one at a time. Then, resonance wavelengths of a corresponding one of ring resonators 128 may be tuned to a target wavelength (i.e., one of carrier wavelengths 108). Next, these operations may be repeated, sequentially, for the other semiconductor optical amplifiers 110 and ring resonators 128. Finally, a resonance wavelength of shared ring resonator 140 may be tuned to set spacing 142.

Figure 3:
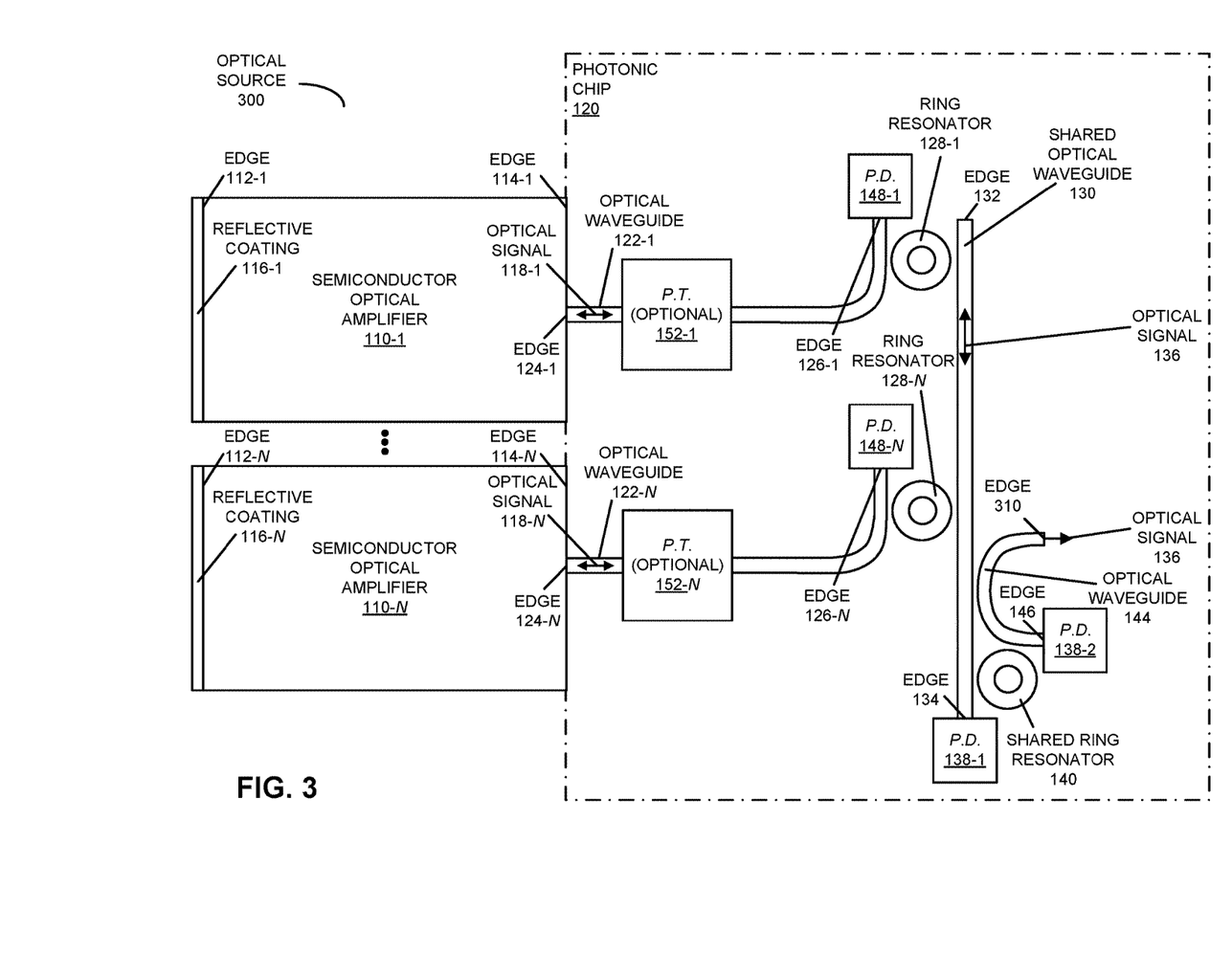
FIG. 3 is a block diagram of a top view of an optical source in accordance with an embodiment of the present disclosure.

We now describe other embodiments of the optical source. FIG. 3 presents a block diagram of a top view of an optical source 300. In this optical source, optical waveguide 144 may be optically coupled to shared optical waveguide 130 (e.g., by a directional coupler), optical waveguide 144 may have an edge 310, and optical signal 136 may be output from optical source 100 at edge 310 of optical waveguide 144. Note that the optical coupling between optical waveguides 122 and ring resonators 128 may be near critically coupled, and the optical coupling between ring resonators 128 and shared optical waveguide 130 may be near critically coupled. In this embodiment, optical source 300 may only need one of photodetectors 138, because they may receive the same optical signal 136.

As shown in FIGS. 1-3, the optical source may provide an output optical signal that includes the multiple carrier wavelengths. This output optical signal may have a nice clean comb locked to the shared ring resonator. However, in other embodiments the optical source provides multiple output optical signals, each of which includes a given carrier wavelength.

Figure 4:
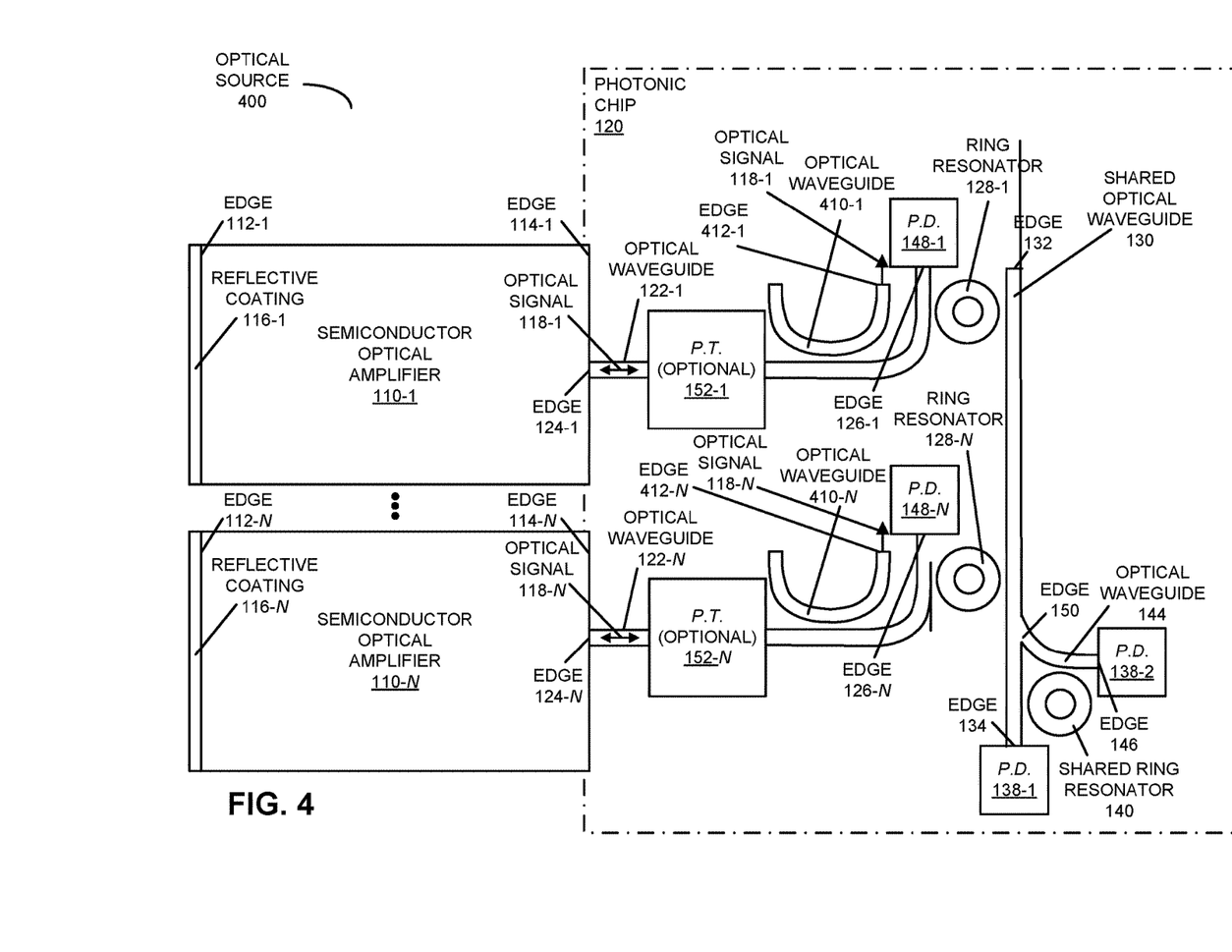
FIG. 4 is a block diagram of a top view of an optical source in accordance with an embodiment of the present disclosure.

For example, as shown in FIG. 4, which presents a block diagram of a top view of an optical source 400, optical source 400 may include optical waveguides 410, optically coupled to optical waveguides 122 (e.g., by directional couplers), that output optical signals 118 on edges 412 of optical waveguides 410. (However, in this and other embodiments of the optical source, a variety of techniques may be used to extract the output optical signal(s) in addition to or different from a directional coupler.)

Figure 5:
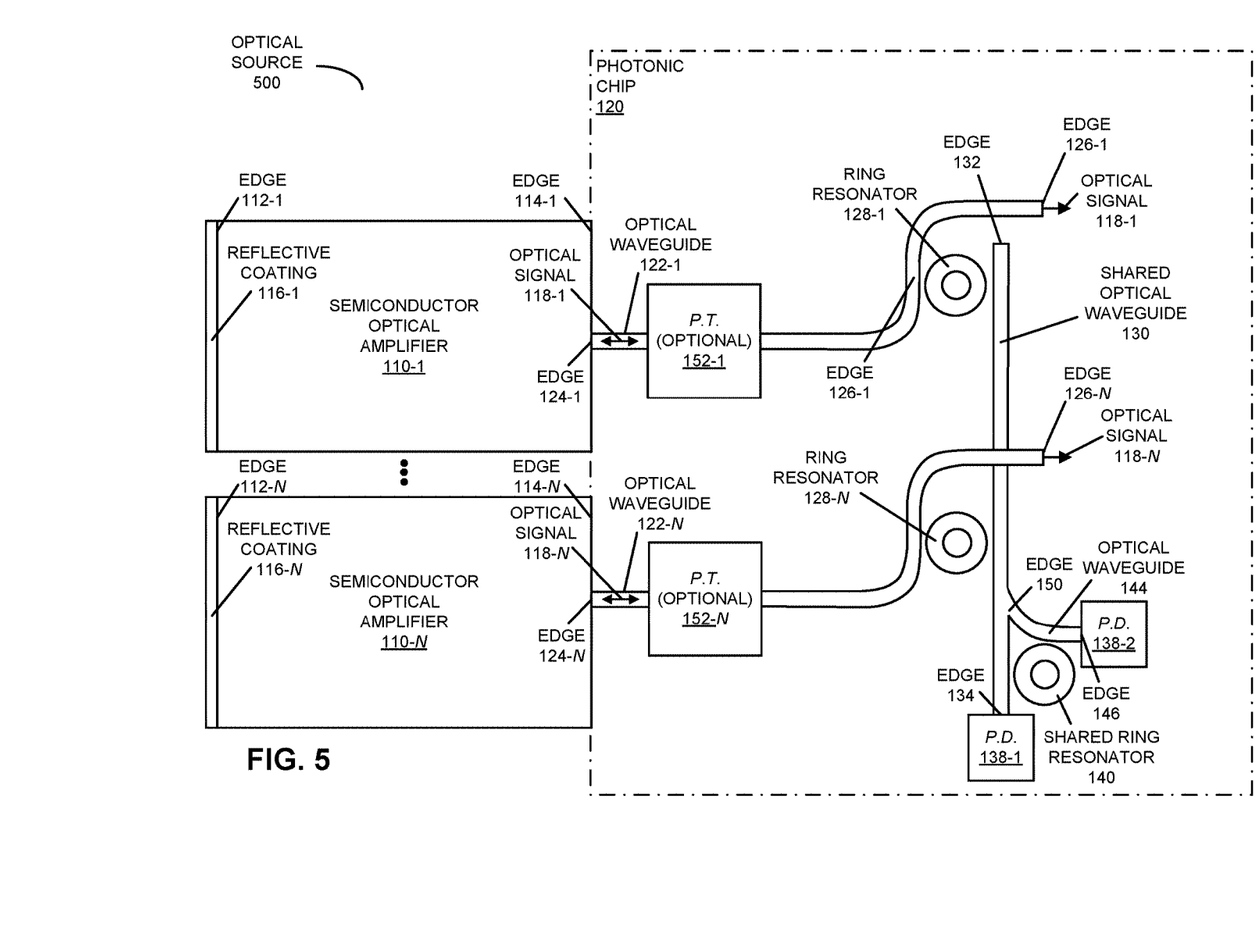
FIG. 5 is a block diagram of a top view of an optical source in accordance with an embodiment of the present disclosure.

FIG. 5 presents a block diagram of a top view of an optical source 500. In FIG. 5, edges 126 of optical waveguides 122 output optical signals 118. Note that the optical coupling between optical waveguides 122 and ring resonators 128 may be under coupled, and the optical coupling between ring resonators 128 and shared optical waveguide 130 may be critically coupled. Moreover, note that the crossing of optical waveguides 122 and 130 may have low loss.

Figure 6:
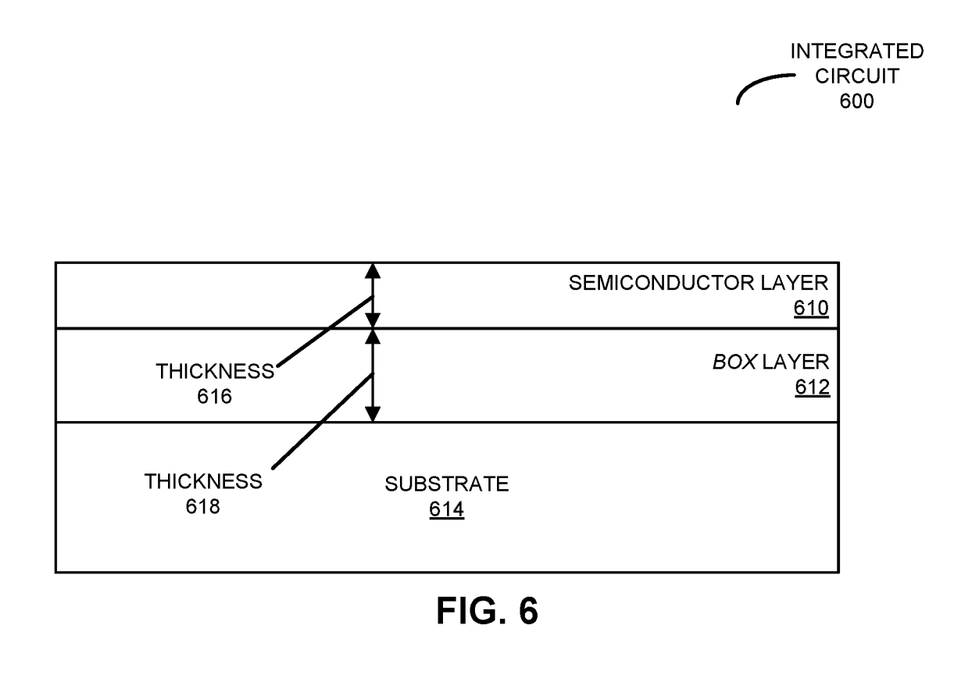
FIG. 6 is a block diagram of a side view of a photonic chip in the optical source of FIG. 1 in accordance with an embodiment of the present disclosure.

Photonic chip 120 may be implemented using a silicon-on-insulator (SOI) technology or platform. This is shown in FIG. 6, which presents a block diagram of a side view of an integrated circuit 600. In this integrated circuit, components in the optical source are implemented, at least in part, in a semiconductor layer 610, such as silicon. Furthermore, semiconductor layer 610 may be disposed on or bonded to a buried-oxide layer 612 (such as silicon-dioxide), which, in turn, is disposed on or grown on a substrate 614 (such as silicon). Note that buried-oxide layer 612 may have a low optical index of refraction so as to provide or offer cladding. Moreover, semiconductor layer 610 may have a high optical index of refraction so as to provide or function as an optical waveguide. However, other materials and/or platforms may be used.

In an exemplary embodiment, optical signals 118 (FIGS. 1-5) have carrier wavelengths 108 between 1.1-1.7 μm, such as an optical signal having a fundamental wavelength of 1.3 or 1.55 μm. Moreover, an optical waveguide may have a thickness 616 between 0.25 and 3 μm, and width between 0.5 and 3 μm. Note that because the optical waveguide may have a quasi-rectangular cross-section, it may be a quasi-single mode component. Moreover, buried-oxide layer 612 may have a thickness 618 between 0.3 and 3 μm.

Furthermore, ring resonators 128 (FIGS. 1-5) may have radii between 5-15 μm and shared ring resonator 140 may have a radius between 10-100 μm.

Referring back to FIG. 1, the optical coupling of semiconductor optical amplifiers 110 and photonic chip 120 may include: edge coupling (such as facet-to-facet optical coupling), vertical or surface-normal coupling (such as a vertical-angled technique using an angled-facet output on semiconductor optical amplifier 110, and grating couplers on photonic chip 120), and/or optical proximity communication (such as using reflective mirrors and/or evanescent coupling). In an exemplary embodiment, edge-to-edge coupling is facilitated by using wide optical waveguides in semiconductor optical amplifiers 110 (such as optical waveguides having a width of 2-3 µm), and optical waveguides 122 may have a width of several hundred nanometers.

Using one of the optical cavities as an illustrative example, during operation a given carrier wavelength in one of optical signals 118 may be passed by one of ring resonators 128, and may be at least partially reflected back and forth between reflective coating 116-1 and shared ring resonator 140, thereby defining an optical cavity in optical source 100. This approach may progressively and/or coherently enhance the amplitude of a tunable wavelength (i.e., a resonance wavelength of one of ring resonators 128) in optical signal 136 using the multi-pass optical cavity. Moreover, because shared ring resonator 140 provides a consistent spacing 142, the different optical paths in optical source 100 may be tuned together. For example, a difference (or an error signal) between the tunable wavelength and a target wavelength of optical source 100 in a given optical path may be measured so that a magnitude of a static difference in the tunable wavelength can be determined. Then, optional thermal-tuning mechanism 210 (FIG. 2) may be used to simultaneously tune the tunable wavelengths of ring resonators 128 as a group.

In some embodiments, optical source 100 is a laser source with a modulated optical signal. Furthermore, optical source 100 can be designed and operated with spectrally flat power for each of the channels in the array.

While tuning of optical source 100 is illustrated using optional thermal-tuning mechanism 210 in FIG. 2, more generally a variety of techniques may be used to vary the tunable wavelengths, including changing the effective index of refraction of ring resonators 128 and/or shared ring resonator 140 to change the effective optical length (and, thus, the resonant wavelengths). The index of refraction may be changed using: an electro-optical material (such as a liquid crystal), via charge-carrier injection and/or thermal tuning (i.e., changing the temperature of ring resonators 128 and/or shared ring resonator 140.

Alternatively or additionally, using one-time 'tuning' the tunable wavelengths can be corrected for an offset from target wavelengths. For example, optical waveguides in ring resonators 128 and/or shared ring resonators 140 may be oxidized to permanently fix the static difference. In this way, optional thermal-tuning mechanism 210 (FIG. 2) may only need to correct changes in the tunable wavelength associated with changes in the ambient temperature or the operating temperature of ring resonators 128 and/or shared ring resonator 140.

Moreover, in some embodiments the tuning efficiency of ring resonators 128 and/or shared ring resonator 140 is improved by removing the substrate (such as substrate 614 in FIG. 6) of ring resonators 128 and/or shared ring resonator 140, thereby increasing the thermal impedance of ring resonator 128 and/or shared ring resonator 140.

As shown in FIG. 1, optical source 100 may include the optical cavities that hybrid integrate the laser gain medium in semiconductor optical amplifiers 110, ring resonators 128 and shared ring resonator 140. However, in general, a wide variety of platforms and integration strategies can be used to implement the optical source. In particular, in addition to the hybrid optical source described previously (with the separate semiconductor optical amplifiers 110 and photonic chip 120), in other embodiments the entire optical source is fabricated using a III-V semiconductor material, including the optical gain medium, the optical waveguides, and the ring resonators. Alternatively, a germanium-based optical gain medium may be included in a silicon-on-insulator platform so that the entire optical source can be fabricated using group IV semiconductors (other than silicon).

In summary, shared ring resonator 140 provides a filter element that correlates the channels, and the design of a Vernier-pair FSR for a given channel may eliminate multiple resonances of a given ring resonator 128 from causing lasing in the optical cavity for the given channel. The shared-bus architecture on an SOI platform may also enable an array WDM laser source with redundancy built-in to mitigate the yield hit of a failure in the III-V semiconductor amplifiers. Moreover, additional elements, such as monitor ports, phase tuners, individual ring-resonator thermal-tuning mechanisms and a regional or common thermal-tuning mechanism may be included in optical source 100. In combination these elements can be used to provide a multiple-wavelength optical source that provides a comb of correlated wavelengths. This optical source can have: high power, a high side-mode suppression ratio (SMSR), a fixed channel spacing, tunable carrier wavelengths, and redundancy for high reliability.

Figure 7:
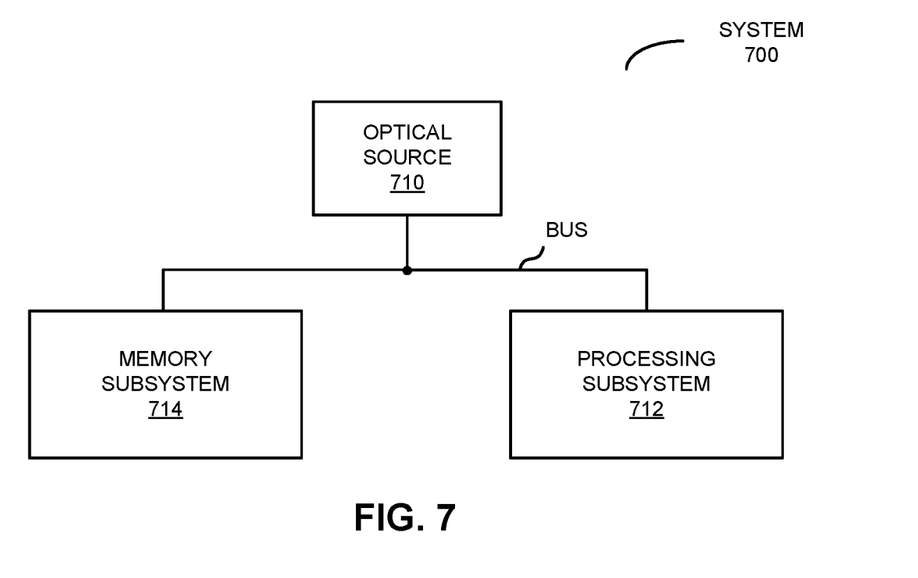
FIG. 7 is a block diagram illustrating a system that includes an optical source in accordance with an embodiment of the present disclosure.

One or more of the preceding embodiments of the optical source may be included in a system and/or an electronic device. This is shown in FIG. 7, which presents a block diagram illustrating a system 700 that includes optical source 710, such as one of the preceding embodiments of the optical source. In some embodiments, system 700 includes processing subsystem 712 (with one or more processors) and memory subsystem 714 (with memory).

In general, functions of optical source 710 and system 700 may be implemented in hardware and/or in software. Thus, system 700 may include one or more program modules or sets of instructions stored in a memory subsystem 714 (such as DRAM or another type of volatile or non-volatile computer-readable memory), which, during operation, may be executed by a processing subsystem 712. Note that the one or more computer programs may constitute a computer-program mechanism. Furthermore, instructions in the various modules in memory subsystem 714 may be implemented in: a high-level procedural language, an object-oriented programming language, and/or in an assembly or machine language. Note that the programming language may be compiled or interpreted, e.g., configurable or configured, to be executed by the processing subsystem.

Components in system 700 may be coupled by signal lines, links or buses. These connections may include electrical, optical, or electro-optical communication of signals and/or data. Furthermore, in the preceding embodiments, some components are shown directly connected to one another, while others are shown connected via intermediate components. In each instance, the method of interconnection, or 'coupling,' establishes some desired communication between two or more circuit nodes, or terminals. Such coupling may often be accomplished using a number of circuit configurations, as will be understood by those of skill in the art; for example, AC coupling and/or DC coupling may be used.

In some embodiments, functionality in these circuits, components and devices may be implemented in one or more: application-specific integrated circuits (ASICs), fieldprogrammable gate arrays (FPGAs), and/or one or more digital signal processors (DSPs). Furthermore, functionality in the preceding embodiments may be implemented more in hardware and less in software, or less in hardware and more in software, as is known in the art. In general, system 700 may be at one location or may be distributed over multiple, geographically dispersed locations.

System 700 may include: a VLSI circuit, a switch, a hub, a bridge, a router, a communication system (such as a wavelength-division-multiplexing communication system), a storage area network, a data center, a network (such as a local area network), and/or a computer system (such as a multiple-core processor computer system). Furthermore, the computer system may include, but is not limited to: a server (such as a multi-socket, multi-rack server), a laptop computer, a communication device or system, a personal computer, a work station, a mainframe computer, a blade, an enterprise computer, a data center, a tablet computer, a supercomputer, a network-attached-storage (NAS) system, a storage-area-network (SAN) system, a media player (such as an MP3 player), an appliance, a subnotebook/netbook, a tablet computer, a smartphone, a cellular telephone, a network appliance, a set-top box, a personal digital assistant (PDA), a toy, a controller, a digital signal processor, a game console, a device controller, a computational engine within an appliance, a consumer-electronic device, a portable computing device or a portable electronic device, a personal organizer, and/or another electronic device.

Moreover, optical source 710 can be used in a wide variety of applications, such as: communications (for example, in a transceiver, an optical interconnect or an optical link, such as for intra-chip or inter-chip communication), a radio-frequency filter, a bio-sensor, data storage (such as an optical-storage device or system), medicine (such as a diagnostic technique or surgery), a barcode scanner, metrology (such as precision measurements of distance), manufacturing (cutting or welding), a lithographic process, data storage (such as an optical-storage device or system) and/or entertainment (a laser light show).

Furthermore, the embodiments of optical source 710 and/or system 700 may include fewer components or additional components. For example, semiconductor substrate 614 (FIG. 6) may be one of multiple substrates in a multi-chip module (such as a multi-chip module in which alternating facing chips that include routing and bridge layers are coupled using optical proximity communication). Furthermore, a wide variety of fabrication techniques may be used to fabricate the optical source in the preceding embodiments of the optical source, as is known to one of skill in the art. For example, instead of flip-chip or wafer bonding, semiconductor optical amplifier 110 (FIG. 1) may be monolithically integrated onto a silicon-on-insulator substrate by epitaxial growth or using another fabrication technique. In addition, a wide variety of optical components may be used in or in conjunction with the optical source.

Although these embodiments are illustrated as having a number of discrete items, these optical components, integrated circuits and the system are intended to be functional descriptions of the various features that may be present rather than structural schematics of the embodiments described herein. Consequently, in these embodiments two or more components may be combined into a single component, and/or a position of one or more components may be changed. In addition, functionality in the preceding embodiments of the optical source, optical source 710 and/or system 700 may be implemented more in hardware and less in software, or less in hardware and more in software, as is known in the art.

While the preceding embodiments have been illustrated with particular elements and compounds, a wide variety of materials and compositions (including stoichiometric and non-stoichiometric compositions) may be used, as is known to one of skill in the art. Thus, while a silicon optical waveguide was illustrated in the preceding embodiments, the communication technique may be used with other materials (such as germanium and/or silicon germanium), as is known to one of skill in the art. Moreover, the semiconductor layer may include polysilicon or amorphous silicon. Furthermore, the materials and compounds in optical source 710 may be fabricated using a wide variety of processing techniques, including: evaporation, sputtering, chemical vapor deposition, molecular-beam epitaxy, wet or dry etching (such as photolithography or direct-write lithography), polishing, etc. In addition, a wide variety of optical components may be used in or in conjunction with the optical device and/or optical source 710.

Figure 8:
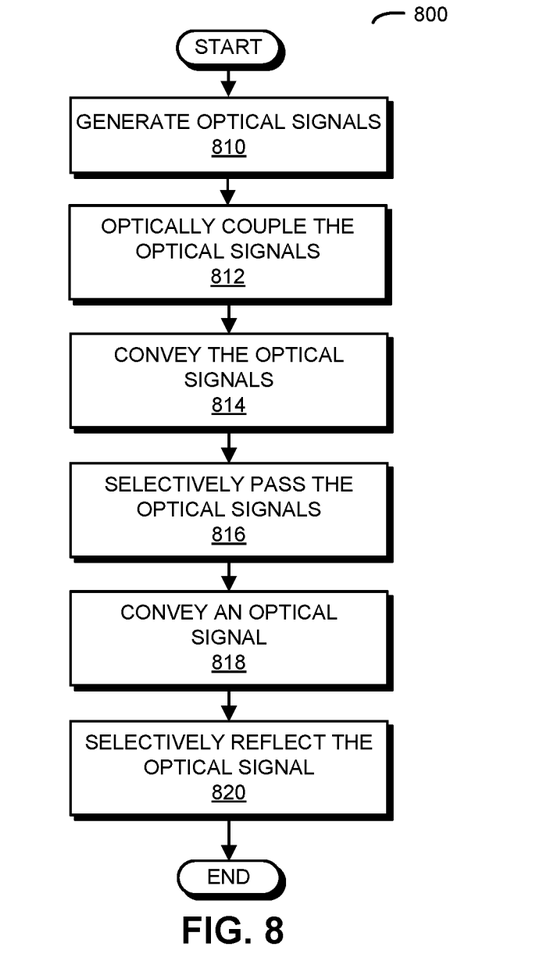
FIG. 8 is a flow chart illustrating a method for generating optical signals using an optical source in accordance with an embodiment of the present disclosure.

We now describe embodiments of a method for generating optical signals. FIG. 8 presents a flow chart illustrating a method 800 for generating optical signals using an optical source, such as one of the preceding embodiments of the optical source. During operation, semiconductor optical amplifiers defined in a semiconductor other than silicon generate optical signals (operation 810) having different carrier wavelengths. Then, the optical signals are optically coupled (operation 812) to a photonic chip optically coupled to the semiconductor optical amplifiers. Moreover, first optical waveguides in the photonic chip convey the optical signals (operation 814), and ring resonators in the photonic chip selectively pass the optical signals (operation 816) having the carrier wavelengths, where a given ring resonator selectively passes a given optical signal, and the ring resonators have different radii with associated resonance wavelengths corresponding to the carrier wavelengths. Furthermore, a shared optical waveguide in the photonic chip conveys an optical signal (operation 818) that includes the carrier wavelengths using a shared optical waveguide. Additionally, a shared ring resonator in the photonic chip selectively reflects the optical signal (operation 820) in the shared optical waveguide toward the ring resonators, where the shared ring resonator has a different radius (such as a larger radius or a smaller radius) than the radii of the ring resonators with an associated resonance wavelength, and an FSR of the shared ring resonator or a multiple of the FSR defines a spacing between the carrier wavelengths in the optical signal.

In some embodiments of method 800, there may be additional or fewer operations. Moreover, the order of the operations may be changed, and/or two or more operations may be combined into a single operation.

In the preceding description, we refer to 'some embodiments.' Note that 'some embodiments' describes a subset of all of the possible embodiments, but does not always specify the same subset of embodiments.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. An optical source, comprising:
semiconductor optical amplifiers defined in a semiconductor other than silicon and having first edges and second edges, wherein the first edges are optically coupled to reflective elements, and wherein, during operation, the semiconductor optical amplifiers provide optical signals having different carrier wavelengths at the second edges; and
a photonic chip optically coupled to the semiconductor optical amplifiers, wherein the photonic chip includes:
first optical waveguides having third edges and fourth edges, wherein the third edges are optically coupled to corresponding second edges of the semiconductor optical amplifiers and, during operation, the first optical waveguides convey the optical signals;
ring resonators, optically coupled to the first optical waveguides between the third edges and the fourth edges, that, during operation, selectively pass corresponding optical signals having the carrier wavelengths, wherein the ring resonators and the reflective elements define optical cavities, and wherein the ring resonators have different radii with associated resonance wavelengths corresponding to the carrier wavelengths;
a shared optical waveguide having a fifth edge and a sixth edge, wherein the shared optical waveguide is optically coupled to the ring resonators between the fifth edge and the sixth edge and, during operation, the shared optical waveguide conveys an optical signal having the carrier wavelengths; and
a shared ring resonator, optically coupled to the shared optical waveguide, that, during operation, selectively passes the optical signal, wherein the shared ring resonator has a different radius than the radii of the ring resonators with an associated resonance wavelength, and
wherein one of a free-spectral range of the shared ring resonator and a multiple of the free-spectral range defines a spacing between the carrier wavelengths in the optical signal.

2. The optical source of claim 1, wherein the optical source further comprises a second optical waveguide having a seventh edge, optically coupled to the shared ring resonator, that, during operation, conveys the optical signal.

3. The optical source of claim 2, wherein the optical source further comprises first photodetectors, optically coupled to the fourth edges, that, during operation, monitor the carrier wavelengths in the optical signals.

4. The optical source of claim 3, further comprising:
a thermal-tuning mechanism thermally coupled to the ring resonators; and
control logic, electrically coupled to the thermal-tuning mechanism and the first photodetectors, that, during operation, tunes the resonance wavelengths of the ring resonators based on the carrier wavelengths monitored by the first photodetectors.

5. The optical source of claim 4, wherein the optical source further comprises:

a second photodetector, optically coupled to the sixth edge, that, during operation, monitors the carrier wavelengths in the optical signal;
a third photodetector, optically coupled to the seventh edge, that, during operation, monitors the carrier wavelengths in the optical signal.

6. The optical source of claim 5, wherein the thermal-tuning mechanism is thermally coupled to the shared ring resonator and the control logic is electrically coupled to the second photodetector and the third photodetector; and
wherein, during operation, the control logic tunes the resonance wavelength of the shared ring resonator based on the carrier wavelengths monitored by at least one of the second photodetector and the third photodetector.

7. The optical source of claim 4, wherein the thermal-tuning mechanism includes one of: a doped semiconductor heater; and a metal heater.

8. The optical source of claim 2, wherein the optical source further comprises third optical waveguides that are optically coupled to the first optical waveguides and that, during operation, output the optical signals on edges of the third optical waveguides.

9. The optical source of claim 1, wherein the second optical waveguide has an eighth edge that is optically coupled to the shared optical waveguide; and
wherein the optical signal is output from the optical source at the fifth edge of the shared optical waveguide.

10. The optical source of claim 9, wherein the optical coupling between the first optical waveguides and the ring resonators is critically coupled, and the optical coupling between the ring resonators and the shared optical waveguide is under coupled.

11. The optical source of claim 1, wherein the second optical waveguide has an eighth edge and the second optical waveguide is optically coupled to the shared optical waveguide; and
wherein the optical signal is output from the optical source at the eighth edge of the second optical waveguide.

12. The optical source of claim 11, wherein the optical coupling between the first optical waveguides and the ring resonators is near critically coupled, and the optical coupling between the ring resonators and the shared optical waveguide is near critically coupled.

13. The optical source of claim 1, wherein the fourth edges of the first optical waveguides output the optical signals.

14. The optical source of claim 13, wherein the optical coupling between the first optical waveguides and the ring resonators is under coupled, and the optical coupling between the ring resonators and the shared optical waveguide is critically coupled.

15. The optical source of claim 1, wherein the optical coupling between the shared optical waveguide and the shared ring resonator and the optical coupling between the shared ring resonator and the second optical waveguide are symmetric.

16. The optical source of claim 1, wherein a given ring resonator and the shared ring resonator are a Vernier ring pair in which a combined free-spectral range of the optical source is a least common multiple of a free-spectral range of the given ring resonator and the free-spectral range of the shared ring resonator.

17. The optical source of claim 1, wherein the photonic chip includes:
a substrate;
a buried-oxide layer disposed on the substrate; and
a semiconductor layer that is one of disposed on the buried-oxide layer and bonded to the buried-oxide layer, wherein optical components are defined in the semiconductor layer.

18. The optical source of claim 1, wherein a combined free-spectral range of a given ring resonator and the shared ring resonator is greater than a gain bandwidth of a given semiconductor optical amplifier that corresponds to the given ring resonator.

19. A system, comprising:
a processor;
a memory coupled to the processor; and
an optical source, wherein the optical source includes:
semiconductor optical amplifiers defined in a semiconductor other than silicon and having first edges and second edges, wherein the first edges are optically coupled to reflective elements, and wherein, during operation, the semiconductor optical amplifiers provide optical signals having different carrier wavelengths at the second edges; and
a photonic chip optically coupled to the semiconductor optical amplifiers, wherein the photonic chip includes:
first optical waveguides having third edges and fourth edges, wherein the third edges are optically coupled to corresponding second edges of the semiconductor optical amplifiers and, during operation, the first optical waveguides convey the optical signals;
ring resonators, optically coupled to the first optical waveguides between the third edges and the fourth edges, that, during operation, selectively pass corresponding optical signals having the carrier wavelengths, wherein the ring resonators and the reflective elements define optical cavities, and wherein the ring resonators have different radii with associated resonance wavelengths corresponding to the carrier wavelengths;
a shared optical waveguide having a fifth edge and a sixth edge, wherein the shared optical waveguide is optically coupled to the ring resonators between the fifth edge and the sixth edge and, during operation, the shared optical waveguide conveys an optical signal having the carrier wavelengths; and
a shared ring resonator, optically coupled to the shared optical waveguide, that, during operation, selectively passes the optical signal, wherein the shared ring resonator has a different radius than the radii of the ring resonators with an associated resonance wavelength, and
wherein one of a free-spectral range of the shared ring resonator and a multiple of the free-spectral range defines a spacing between the carrier wavelengths in the optical signal.

20. A method for generating optical signals using an optical source, the method comprising:
generating optical signals having different carrier wavelengths using semiconductor optical amplifiers defined in a semiconductor other than silicon;
optically coupling the optical signals to a photonic chip optically coupled to the semiconductor optical amplifiers;
conveying the optical signals using first optical waveguides;
selectively passing the optical signals having the carrier wavelengths using ring resonators, wherein a given ring resonator selectively passes a given optical signal, and wherein the ring resonators have different radii with associated resonance wavelengths corresponding to the carrier wavelengths;
conveying an optical signal that includes the carrier wavelengths using a shared optical waveguide; and
selectively reflecting the optical signal in the shared optical waveguide toward the ring resonators using a shared ring resonator, wherein the shared ring resonator has a different radius than the radii of the ring resonators with an associated resonance wavelength, and
wherein one of a free-spectral range of the shared ring resonator and a multiple of the free-spectral range defines a spacing between the carrier wavelengths in the optical signal.

* * * * *

UNITED STATES PATENT AND TRADEMARK OFFICE
CERTIFICATE OF CORRECTION

| | |
|---|---|
| PATENT NO. | : 10,141,710 B2 |
| APPLICATION NO. | : 15/047090 |
| DATED | : November 27, 2018 |
| INVENTOR(S) | : Bovington et al. |

It is certified that error appears in the above-identified patent and that said Letters Patent is hereby corrected as shown below:

On the Title Page

Column 2, under Other Publications, Line 1, delete "Niemoto" and insert -- Nemoto --, therefor.

Signed and Sealed this
Twenty-sixth Day of November, 2019

Andrei Iancu
*Director of the United States Patent and Trademark Office*